INJECTION PRINTING OF ELECTRICAL CIRCUIT COMPONENTS

Filed June 24, 1966 3 Sheets-Sheet 1

INVENTORS
THOMAS J. COCHRAN
CHARLES P. COUGHLIN
LAWRENCE P. REMSEN
ROBERT J. STRAUB

BY Henry Powers
ATTORNEY 3,384,931

INJECTION PRINTING OF ELECTRICAL CIRCUIT COMPONENTS

Thomas J. Cochran, La Grangeville, Charles P. Coughlin, Chelsea, Lawrence P. Remsen, Stanfordville, and Robert J. Straub, Poughkeepsie, N.Y., assignors to International Business Machines Corporation, Armonk, N.Y., a corporation of New York Filed June 24, 1966, Ser. No. 560,196
15 Claims. (Cl. 18—30)

This invention relates to the printing of circuit components on a substrate, and more particularly to the printing of resistors, circuits and the like on a substrate by injection of a suitable pigment through a stencil overlying the substrate.

The injection printing of conventionally dimensioned electrical circuit components, such as resistors, on a substrate through stencils is known. The stencils heretofore employed have been generally constructed of an assembly of either fixed or movable plate-like elements, each containing a plurality of channels which must functionally register with corresponding channels in adjacent units to define a matrix of channels which extend through the stencil to a recess in a bottom face. Such a plurality of registering channels have been considered necessary for venting and charging the recess respectively, to an outlet and with a suitable charge source of printing pigment. However, vent outlet and charge source are also required to be in register with associated channels of the stencil. Although no difficulty has been encountered for effecting register between the channels of the various stencil elements for the printing of conventional circuits, such a technique does not lend itself for use in printing miniaturized circuits and components thereof.

Accordingly, it is an object of this invention to provide a simplified means for injection printing of miniaturized electrical circuit components.

It is another object of this invention to provide an injection printer for quantitatively injecting conductive or resistor pigment through a stencil into a printed pattern on a substrate.

Other objects and advantages will become more apparent from the following description and drawings in which.

Figure 1:
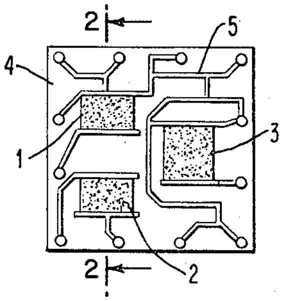
FIGURE 1 is a perspective view of a miniaturized printed circuit contemplated within this invention.
Figure 2:
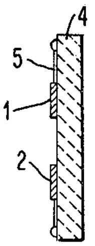
FIGURE 2 is a sectional view taken along lines II—II of FIGURE 1.

Referring to the drawings, FIGURES 1 and 2 are presented to illustrate the miniature circuits contemplated to be printed by this invention. The specific circuit illustrated comprises three printed resistors 1, 2 and 3 each about 0.0015 inch thick and having planar dimensions of, respectively, 1/16 x 1/8", 1/16 x 1/8" and 1/8 x 1/8" deposited on a 7/16 x 7/16" substrate 4 formed of non-conductive material such as ceramic, glass, plastic and the like. Also shown to be deposited on the substrate 4 are additional circuit elements such as conductors 5 and terminals 6 which may be applied to the substrate subsequent to and preferably prior to printing of the resistors. These associated elements may be applied by any conventional technique available for preparing printed circuits, and preferably they are printed with conductive pigment in accordance with the invention.

The injection printer apparatus, as shown in the drawings, comprises a stencil or mask 7 having recesses 1', 2' and 3' in the bottom face 10 thereof corresponding in shape and dimensions to the resistor elements 1, 2 and 3 to be printed on substrate 4, which is shown to be a ceramic composition. Communicating with the recesses is a multitude of minute apertures 8 extending through the stencil from the recesses to the top surface 9 of the stencil with the apertures uniformly dispersed so as to form a mesh which coextends the recesses. For purposes of illustration, a stencil employed in accordance with this invention was a 4 mil thick sheet of molybdenum characterized by 1½ mil deep recesses superimposed with a uniform dispersion of 3½ mil diameter apertures on disposed 10 mil centers.

Figures 9, 12:
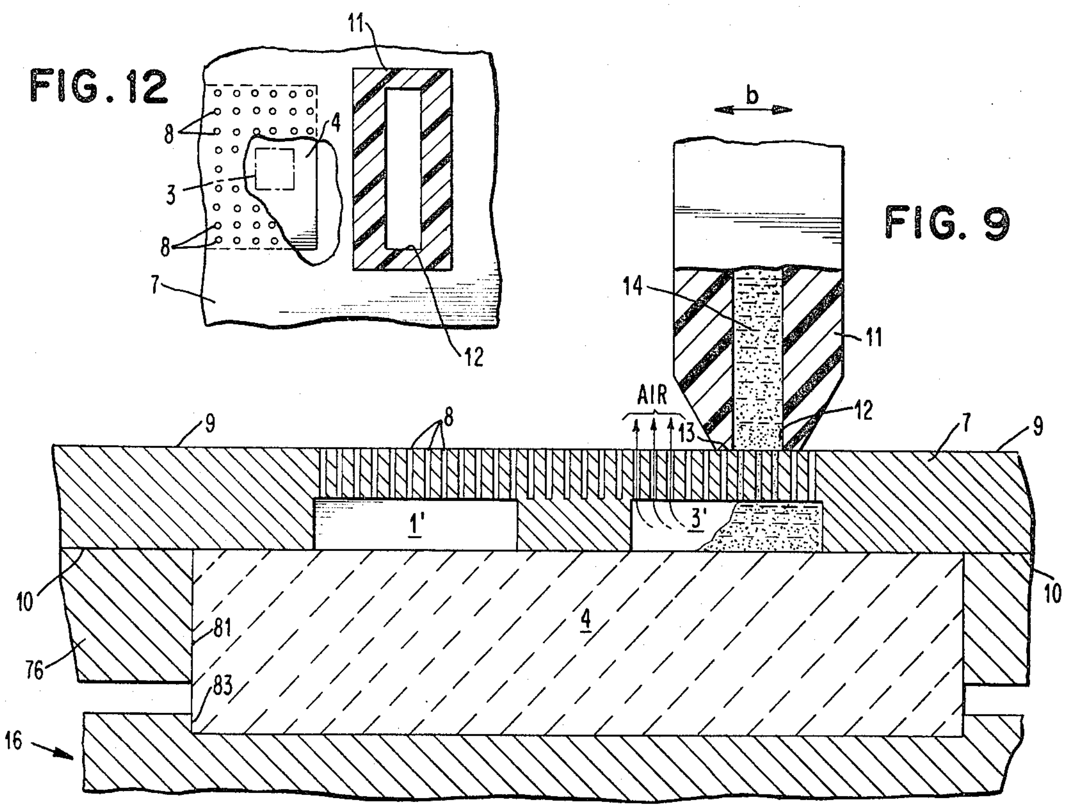
FIGURE 9 is an exaggerated and enlarged sectional view illustrating the coaction between a stencil, injector and substrate in accordance with the invention.
FIGURE 12 is a fragmentary view illustrating the coaction of the injector, the mesh of the stencil and the substrate in accordance with the invention.
Figures 10, 11:
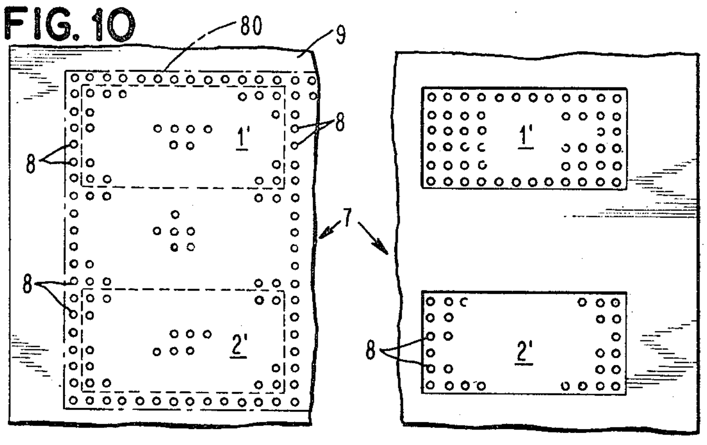
FIGURE 10 is an exaggerated and enlarged view illustrating the top face of a portion of a stencil employed in this invention.
FIGURE 11 is an exaggerated and enlarged view illustrating the bottom face of the stencil portion of FIGURE 10.
Figure 4:
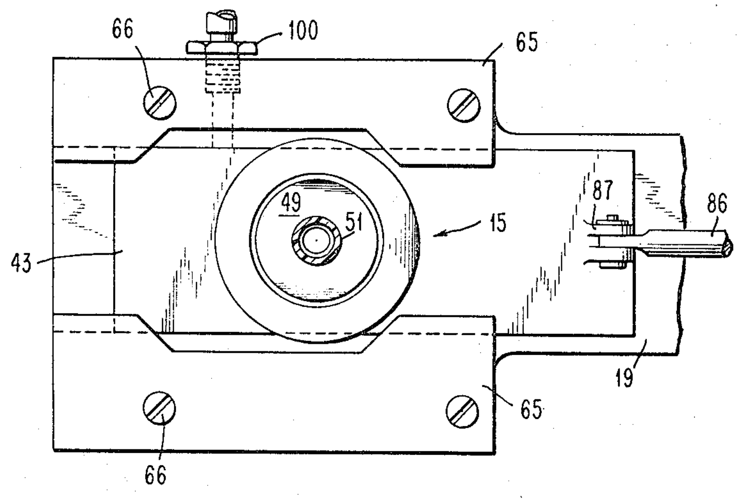
FIGURE 4 is a plan view of a portion of the embodiment of FIGURE 3.
Figure 5:
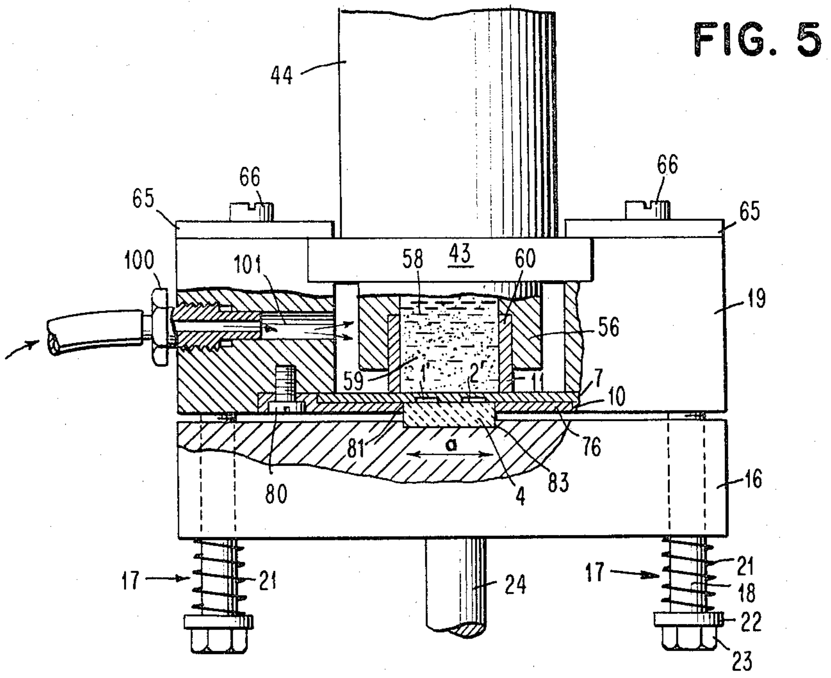
FIGURE 5 is an end view of the embodiments of FIGURE 3.
Figure 6:
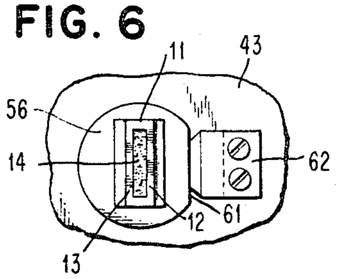
FIGURE 6 is a view taken along lines VI—VI of FIGURE 3.
Figure 7:
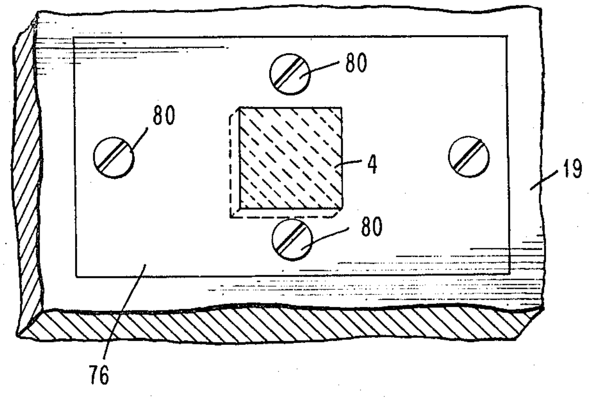
FIGURE 7 is a view taken along lines VII—VII of FIGURE 3.
Figure 8:
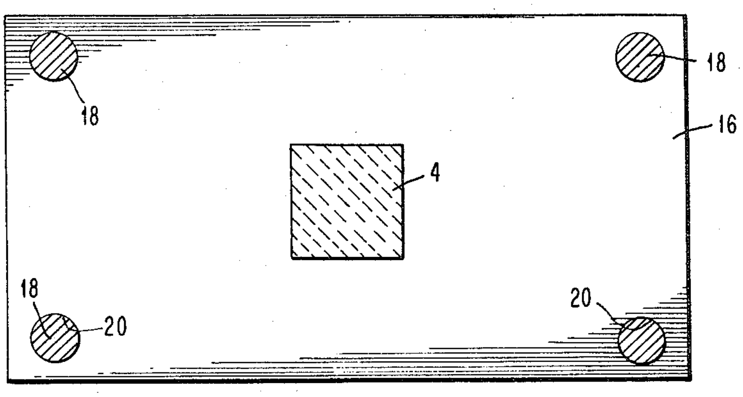
FIGURE 8 is a view taken along lines VIII—VIII of FIGURE 3.

The injection printing is accomplished by means of an injector whose nozzle 11 continuously extrudes a narrow band of a viscous injectable printing pigment as it is forced to slide longitudinally or lengthwise across the top face 9 of the stencil 7. The nozzle is biased against the stencil in sealing relationship therewith so as to force the extrudate into the recesses through the apertures 8, immediately encompassed by the nozzle orifice 12. Such a sealing relationship between nozzle and the top face of the stencil is readily obtained by a preferred construction of the nozzle from a compressibly resilient material such as rubber, polyurethane, neoprene and the like. The nozzle orifice is defined by an elongated slotted passage 14 in the nozzle, whose length laterally spans (direction *a*, FIGURE 5A) across the apertures 8 of the stencil. The width of the nozzle orifice defined by the slotted passage spans only a few of apertures 8 longitudinally (direction *b*, FIGURE 9) of the stencil. A nozzle 11 which was used with the molybdenum stencil, specifically identified above, had a rectangular orifice with dimensions of 0.5" x 0.9 circumscribed by a lip 13 (FIGURE 9) having a width 11 of about 0.05".

The nozzle 11 is part of a head assembly 15 positioned above a support platen 16 for coaction therewith into reciprocable open and closed position for the insertion and printing of substrates and for withdrawal of substrates after printing. Such coaction may be obtained by any means which effects a reciprocating relative movement between the units. In the embodiment shown, such coaction is effected by a combined hydraulic and spring action. The spring action is obtained by means of spaced biasing units 17 which urge the support platen 16 into a normally closed relationship with the head assembly 15. The biasing units 17 include, in one form, bolts 18 threaded at their lower end into the bottom of a slide block 19 of the head assembly 15. The bolts 18 are slidably disposed through bores 20, in support of platen 16, and a coiled compression spring 21 is disposed about the bolts between the bottom surface of support platen 16 and a washer 22 supported on the bolt heads 23. These coiled compression springs 21 normally bias the support platen 16 into closed relationship with head assembly 15. As will be noted, the bolts 18 of the biasing units 17 also function as guides for proper registration of the lower platen 16 with head assembly 15.

Figure 3:
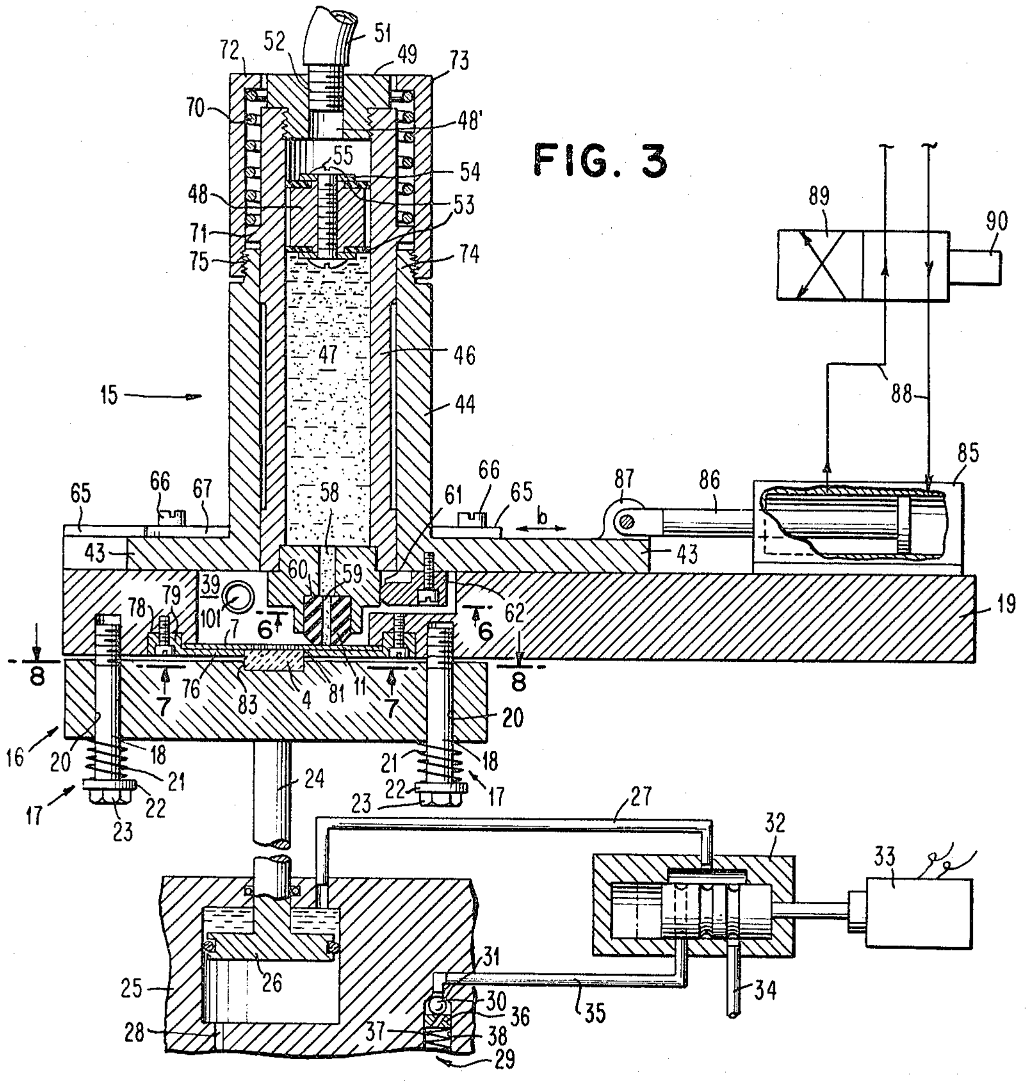
FIGURE 3 is a sectional view of a schematic representation of one embodiment of this invention.

The support platen 16 is opened or separated from the head assembly 15 by means of a conventional hydraulic ram 24 extending from the bottom of the platen. The ram is actuated by conventional hydraulic cylinders which are adapted to be pressurized with fluid for movement in one direction with controlled release of the fluid pressure by bleed valves and the like. As shown in FIGURE 3, this may comprise a hydraulic cylinder 25 and its associated piston 26 suitably secured to ram 24. Pressure to the top of piston 26 in the cylinder 25 is applied through a selector valve 32 by means of any suitable inlet connection such as 27; and the bottom of the cylinder is vented by means of any suitable port such as 28 which may communicate with the atmosphere. The selector valve 32 may be actuated by a solenoid 33 to selectively connect the inlet 27 to either a conduit 34 of a hydraulic pressure source or to a conduit 35 of bleed valve 29.

The bleed valve 29, for release of hydraulic pressure in the cylinder 25, may in one form comprise a ball check 30 which normally engages a conical seat 31 to close conduit 35. The desired control of pressure release may be maintained by means of a vented follower 36 and a coil spring 37 mounted in bore 38 to act with adjustable pressure on ball check 30.

The slide block 19 of head assembly 15 contains a vertically extending compartment 39 with the lateral edges at its top opening longitudinally grooved to provide shoulders 40 which are in planar extension with a groove 41 to form a slide bed for slide unit 42. The slide unit 42 is formed with a base plate 43 and a vertically projecting tube housing 44 containing a cylindrical bore 45 for slidably receiving a pigment tube 46 which contains a printing pigment or paste 47 of the desired electrical properties for the circuit elements to be printed. Such pigments are conventional and commercially available, and, for example, for resistors will normally be comprised of carbon black, a varnish binder, a filler and a solvent. The slide unit 42 is confined to movement in the slide bed by means of slide covers 65 which are secured to the slide block 19 by means of fasteners 66. A recessed portion 67 on each slide cover 65 accommodates the cylindrical tube housing 44 carried by the base plate 43.

A free floating pressure transmitting piston unit 48 is mounted in the pigment tube 46 adjacent the top thereof, and will be forced against the pigment when tube 46 is pressurized by means of an inlet port 52 of a closure cap 49 threaded into the top of tube 46. Threadedly mounted in the inlet port 48′ is a fitting 50 for coupling with conduit 51 of a suitable fluid pressure source. A fluid tight sealing of the piston unit 48 with the sidewalls of the tube is obtained by means of gaskets 53 sandwiched against opposite ends of the unit by retainers 54 which are secured to the piston by means of fasteners 55.

The lower end of pigment tube 46 has threadedly mounted in it a cylindrical nozzle holder 56 which is provided in the lower face with a transversely elongated nose portion 57 into which is seated the resilient nozzle 11. A transversely elongated passage 58 through the holder 56 provides communication between the interior of pigment tube 46 and a corresponding elongated passage 59 of nozzle 11 whose upper is fixedly secured, by adhesives and the like, within a seat formed by an annular groove 60 at the bottom of the nozzle holder passage 58. Orientation of the nozzle holder 56 and its associated nozzle 11 is obtained by means of a flat portion 61, on the peripheral of the holder 56, which keys with a keeper 62 suitably secured by a fastener to the bottom face of base plate 43. Stepped portions 64 are provided at opposite ends of compartment 39 to accommodate for override by the top of nozzle holder 56 and to accommodate keeper 62.

Pigment tube 46 is biased for limited longitudinal movement downwardly in tube housing 44 by means of a coiled compression spring 70 mounted about the upper portion of the tube 46 defined by a peripheral ridge 71 which is acted upon by the coiled compression spring 70. The compression spring 70 is forced against the tube ridge 71 with adjustable pressure by means of an inwardly extending annular rim 72 of a cylindrical retainer 73 mounted over coil spring 70 and threadedly attached at its lower end to a skirt 74 formed by an annular groove 75 at the top of tube housing 44. The top of skirt 74 also serves as a stop for the peripheral ridge 71 of pigment tube 46 to limit its movement in housing 44.

The stencil 9 is mounted by means of a holder 76 to a depressed seat defined in the slide block compartment 39 which comprises a downwardly depending rim portion 77 forming a sidewall of a rectangular groove 78 which receives the complementary upstanding rim 79 of holder 76. In general the seat forming rim portion 77 forms an opening which circumscribes not only the recess/aperture faying portion or mask 80 of the stencil but also circumscribes an imperforate portion 61 of the stencil adjacent the faying area. Such an arrangement permits the moving injector nozzle 11 to override the faying surface in each direction and seat itself on the imperforate portions of the stencil which act as a valve for sealing the orifice between printing functions of the unit.

The rim 79 of holder 76 defines a relatively deep recess in its top surface for seating the stencil, and serves to orientate the stencil for mounting to the head assembly. As indicated above, the holder rim 79 is received in the groove 78, and there secured by means of a fastener 80.

Access to the faying surface, for a substrate, is provided by means of an opening circumscribing the faying area 80 of the stencil, and preferably also having dimensions corresponding to like planar dimensions of the substrate to be printed. In this manner the opening 81 orientates the substrate seated in it for proper registration with the faying area 80 of the stencil. A corresponding recess 83 in the top face of lower platen 16 provides a seat for the substrate 4 which orients it into proper registry for insertion into mask holder opening 81, and against the faying area of the stencil.

The movement of the slide unit 42 and its supported elements relative to the slide block 19 may be effected by any conventional means. In the embodiment shown in FIGURE 3, such movement is obtained by means of a double acting power cylinder 85 having its piston rod 86 connected to ears 87 provided on the side unit base plate 43. The direction of the stroke of power cylinder 85 may be controlled by connection of its pressure lines 88 to a reversing valve 89 which is actuated by solenoid 90.

If desired, separation of the substrate 4 from the stencil after printing can be facilitated by providing a quick positive pneumatic pulse in compartment 39 through a fitting 100 mounted in a bore 101 extending through a wall of the slide block 19. A typical unit which provides such pulses of about 3 to 5 millisecond duration is the Driver Valve Assembly unit of the Skinner Manufacturing Co. located at New Britain, Connecticut.

In operation, with the selector 32 in the position shown, the lower platen is actuated into the open position against biasing units 17 by injecting a hydraulic fluid from conduit 34 into a portion of the cylinder 25 defined above piston 26. With the lower platen 16 in the open position a new substrate 4 is seated in recess 83 of the platen, and the valve 32 is actuated to register cylinder line 27 with bleed valve 29. The controlled slow release of fluid pressure from cylinder 25 by the bleed valve 29 permits the lower platen to be gently raised to the closed position by the biasing action of biasing units 17. Closure of the lower platen 16 brings the substrate 4 against the lower faying area of stencil 7 through the opening 81 of mask holder 76. With the injector chamber in pigment tube 46 above piston unit 48 pressurized at about 6 p.s.i. and the reversing valve 89 in the position shown, injection of the hydraulic fluid in power cylinder 85 will force the slide unit 42 and its supported elements to move to the left. This action will also sweep the nozzle 11 in traverse over the faying area 80 of stencil 7 and across to the imperforate stencil portions adjacent a rim portion 77. During the sweep of the nozzle 11, across the stencil, it injects the pigment under sufficient pressure through the apertures 8 encompassed by the orifice 12 of the nozzle to completely fill the portion of the recesses under them with air, solvent vapors and the like, vented through the remaining apertures. One stroke of the nozzle 11 across the stencil 7 has been found sufficient to print a circuit component of high fidelity, and the return stroke of the nozzle has been reserved for printing a successive substrate.

After the printing operation the selector valve 32 is actuated to register cylinder conduit 27 with the pressure source conduit 34. This injects fluid pressure into cylinder 25 to lower the platen 16 into the open position where the printed substrate is removed and a new substrate mounted for repetition of the printing operation which, as will be noted, will be effected by the return stroke of nozzle 11 across stencil 7. Although a manual manipulation has been shown for mounting and removing substrates on the lower platen 16 for purposes of simplicity, it is to be understood that conventional automatic feed mechanisms may be employed for mounting and removing the substrate.

While the invention has been particularly shown and described with reference to the preferred embodiments thereof, it will be understood by those skilled in the art that various changes in form and detail may be made therein without departing from the spirit and scope of the invention.

What is claimed is:

1. Apparatus for injection printing of electrical circuit elements on a substrate comprising:

a stencil having a recess in the bottom face thereof corresponding to the element to be printed on said substrate;

a mesh of minute apertures uniformly dispersed over said recess and extending therefrom to the top surface of said stencil;

an injection nozzle slidably engaging the said top surface of said stencil in sealing relationship therewith for restrictively injecting a narrow band of a viscous extrudable printing pigment into said recess through the said apertures with the length of said band extending across said apertures laterally of said mesh and with the width of band traversing only a few of said apertures longitudinally of said mesh;

driving means for moving said nozzle longitudinally across said mesh in said abutment with said stencil; and injection means for continually injecting said pigment as said band through said nozzle during its said movement.

2. The apparatus of claim 1 including a support for said substrate, and means for effective relative movement between said stencil and support into closed and open positions therebetween whereby said stencil is adapted to engage with and separate from a substrate mounted in said support.

3. The apparatus of claim 2 including means for subjecting said mesh at the top surface of said stencil to a positive pneumatic pulse when said stencil begins to separate from said substrate.

4. The apparatus of claim 1 wherein said injection means comprises a cylinder having a closed end and an open end defining an injection passage adapted to hold a charge of said pigment, and wherein said nozzle comprises a hollow resilient member secured to the open end of said cylinder and forming a continuum of said passage with said member having an extrusion orifice defining a narrow slot corresponding to said band, and including an inlet in the closed end of said cylinder for pressurizing said passage.

5. The apparatus of claim 4 including a support for said substrate, and means for effecting relative movement between said support and said stencil to the closed and open positions therebetween whereby said stencil is adapted to engage with and separate from a substrate mounted on said support.

6. The apparatus of claim 5 including fluid pressure means for subjecting said mesh at the top surface of said stencil to a quick positive pneumatic pulse when separation begins between said substrate and said stencil.

7. The apparatus of claim 6 wherein the duration of said pulse does not exceed the millisecond range.

8. The apparatus of claim 4 including a floating piston in said passage with said piston disposed adjacent said inlet and adapted for movement toward the open end of said passage upon pressurization thereof whereby said piston is adapted to express a charge of said pigment in said passage out of said orifice as an extrudate defining said band.

9. The apparatus of claim 8 including a support for said substrate and means for effecting relative movement between said stencil and support into closed and open positions therebetween whereby said stencil is adapted to engage with and separate from a substrate mounted on said support.

10. The apparatus of claim 9 including fluid pressure means for subjecting said mesh at the top surface of said stencil to a quick positive pneumatic pulse when separation begins between said substrate and said stencil.

11. The apparatus of claim 10 wherein said fluid pressure means provides said pulse of a duration not exceeding the millisecond range.

12. The apparatus of claim 4 including spring means for biasing said nozzle in abutment with the top surface of said stencil in its said sealing relationship therewith.

13. The apparatus of claim 12 including a support for said substrate and means for effecting relative movement between said stencil and said support into closed and open positions therebetween whereby said stencil is adapted to engage with and separate from a substrate mounted on said support.

14. The apparatus of claim 13 including fluid pressure means for subjecting said substrate at the top surface of said stencil to a quick positive pneumatic pulse when separation begins between said stencil and said substrate.

15. The apparatus of claim 14 wherein said fluid pressure means provides said pulse of a duration not exceeding the millisecond range.

References Cited

UNITED STATES PATENTS

| | | | |
|---|---|---|---|
| 1,731,006 | 10/1929 | Goodwin et al. | 18—30 |
| 1,802,978 | 4/1931 | MacDonald | 18—30 |
| 2,318,465 | 5/1943 | Chollar | 101—125 |
| 1,877,298 | 9/1932 | Goodwin | 18—30 X |

FOREIGN PATENTS

| | | |
|---|---|---|
| 905,063 | 2/1954 | Germany. |

WILBUR L. McBAY, *Primary Examiner.*